United States Patent
Son et al.

(10) Patent No.: US 12,225,788 B2
(45) Date of Patent: Feb. 11, 2025

(54) DISPLAY DEVICE

(71) Applicant: Samsung Display Co., LTD., Yongin-si (KR)

(72) Inventors: Yong Duck Son, Seongnam-si (KR); Yul Kyu Lee, Hwaseong-si (KR); Min-Sik Jung, Seoul (KR); Jun Hwi Park, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 675 days.

(21) Appl. No.: 17/507,782

(22) Filed: Oct. 21, 2021

(65) Prior Publication Data
US 2022/0130939 A1      Apr. 28, 2022

(30) Foreign Application Priority Data

Oct. 22, 2020   (KR) .................. 10-2020-0137708

(51) Int. Cl.
  *H01L 33/00*    (2010.01)
  *H10K 59/131*   (2023.01)
(52) U.S. Cl.
  CPC .................. *H10K 59/131* (2023.02)
(58) Field of Classification Search
  None
  See application file for complete search history.

(56) References Cited

U.S. PATENT DOCUMENTS

2021/0373377 A1* 12/2021 Kim .................. G02F 1/136204
2022/0075483 A1*  3/2022 Yan ........................ G06F 3/0418

FOREIGN PATENT DOCUMENTS

| KR | 100965582 B1    | 6/2010 |
| KR | 1020200003332 A | 1/2020 |
| KR | 1020200028567 A | 3/2020 |
| KR | 1020200070178 A | 6/2020 |
| KR | 1020200074347 A | 6/2020 |

* cited by examiner

*Primary Examiner* — Bradley Smith
(74) *Attorney, Agent, or Firm* — CANTOR COLBURN LLP

(57) ABSTRACT

A display device includes: a substrate including a display area and a peripheral area positioned outside the display area; a first power supply line positioned in the peripheral area; a first insulating layer positioned on the first power supply line; and a second power supply line positioned on the first insulating layer in the peripheral area. The first power supply line includes a first main wire extending in a first direction and a first sub-wire diverging toward the display area from the first main wire, the second power supply line includes a second main wire extending in the first direction and a second sub-wire diverging toward the display area from the second main wire, the first main wire includes an internal edge positioned near the first sub-wire and an external edge facing the internal edge, and the second main wire does not overlap the internal edge in a plan view.

20 Claims, 20 Drawing Sheets

DISPLAY DEVICE

This application claims priority to Korean Patent Application No. 10-2020-0137708 filed on Oct. 22, 2020, and all the benefits accruing therefrom under 35 U.S.C. § 119, the content of which in its entirety is herein incorporated by reference.

BACKGROUND

1. Field

The present disclosure relates to a display device.

2. Description of the Related Art

A display device is a device for displaying images on a screen, and includes a liquid crystal display ("LCD") and an organic light emitting diode ("OLED"). The display device is used for various electronic devices such as portable phones, GPSs, digital cameras, electronic books, portable game devices, or various terminals.

Since the OLED device has a self-luminance characteristic and does not require a separate light source, unlike the LCD, a thickness and a weight thereof may be reduced. Further, the OLED device has high-grade characteristics such as low power consumption, high luminance, and a high response speed.

When static electricity is generated to the display device, the static electricity may be input into the display device through a wire provided to the display device. When the static electricity is input to the display device, it may damage an insulating layer or a switching element. Further, by the damage on the insulating layer, a wire positioned on an upper side of the insulating layer and a wire positioned on a lower side of the insulating layer are short-circuited.

SUMMARY

The described technology has been made in an effort to provide a display device for preventing defects when static electricity is generated and is input to the display device.

An embodiment provides a display device including: a substrate including a display area and a peripheral area positioned outside the display area; a first power supply line positioned in the peripheral area of the substrate; a first insulating layer positioned on the first power supply line; and a second power supply line positioned on the first insulating layer and positioned in the peripheral area of the substrate, where the first power supply line includes a first main wire extending in a first direction and a first sub-wire diverging toward the display area from the first main wire, the second power supply line includes a second main wire extending in the first direction and a second sub-wire diverging toward the display area from the second main wire, the first main wire includes an internal edge positioned near the first sub-wire and facing the display area and an external edge opposite to the internal edge, and the second main wire does not overlap the internal edge of the first main wire in a plan view.

The second main wire may include an internal edge positioned near the second sub-wire and facing the display area and an external edge opposite to the internal edge of the second main wire, and the internal edge of the second main wire may be spaced apart from the internal edge of the first main wire in a plan view.

A spaced distance between the internal edge of the second main wire and the internal edge of the first main wire may be equal to or greater than about 1 micrometers (μm) and equal to or less than about 500 μm in a second direction perpendicular to the first direction.

The second main wire may overlap part of the first main wire in the plan view, and a width of a portion in which the first main wire does not overlap the second main wire may be equal to or greater than 1 μm and equal to or less than 500 μm in a second direction perpendicular to the first direction.

The display device may further include: a first power line electrically connected to the first power supply line and positioned in the display area of the substrate; and a second power line electrically connected to the second power supply line and positioned in the display area of the substrate.

The first power line and the second power line may extend to the peripheral area of the substrate.

The display device may further include a second insulating layer positioned on the first power line and the second power line, where the first power supply line may be positioned on the second insulating layer.

The display device may further include a connection electrode positioned on the first insulating layer and connected to the first power line and the first power supply line.

The first insulating layer and the second insulating layer may define a first opening overlapping the first power line in the plan view, the connection electrode may be connected to the first power line through the first opening, the first insulating layer may define a second opening overlapping the first sub-wire in the plan view, and the connection electrode may be connected to the first sub-wire through the second opening.

The first power line and the second power line may be positioned in a same layer as the first power supply line.

The display device may further include a connection electrode positioned on the first insulating layer and connected to the first power line and the first power supply line.

The first insulating layer may define a third opening overlapping the second power line and the second sub-wire in the plan view, and the second sub-wire may be connected to the second power line through the third opening.

The display device may further include the first power line including a first portion and a second portion positioned in different layers from each other, a second insulating layer positioned between the first portion and the second portion, and a connection electrode which connects the first portion and the second portion.

The first insulating layer and the second insulating layer may define a fourth opening overlapping the first portion of the first power line in the plan view, the connection electrode may be connected to the first portion of the first power line through the fourth opening, the first insulating layer may define a fifth opening overlapping the second portion of the first power line in the plan view, and the connection electrode may be connected to the second portion of the first power line through the fifth opening.

A driving voltage may be applied to the first power supply line, and a common voltage may be applied to the second power supply line.

Another embodiment provides a display device including: a substrate including a display area and a peripheral area positioned outside the display area; a first power supply line positioned in the peripheral area of the substrate; an insulating layer positioned on the first power supply line; a second power supply line positioned on the insulating layer and positioned in the peripheral area of the substrate; a first power line electrically connected to the first power supply line and positioned in the display area of the substrate; and a second power line electrically connected to the second power supply line and positioned in the display area of the substrate, where the first power supply line includes a first main wire extending in a first direction and a first sub-wire diverging toward the first power line from the first main wire, the second power supply line includes a second main wire extending in the first direction and a second sub-wire diverging toward the second power line from the second main wire, and the second main wire does not overlap a portion in which the first sub-wire diverges from the first main wire in a plan view.

The first main wire may include an internal edge positioned near the first sub-wire and in parallel with the first direction and an external edge opposite to the internal edge, and the second main wire may not overlap the internal edge of the first main wire.

The external edge of the first main wire may be parallel to the first direction, and the second main wire may overlap the external edge of the first main wire in the plan view.

The second main wire may include an internal edge positioned near the second sub-wire and an external edge opposite to the internal edge of the second main wire, and the external edge of the second main wire may correspond to the external edge of the first main wire.

The second main wire may include an internal edge positioned near the second sub-wire and an external edge opposite to the internal edge of the second main wire, and a spaced distance between the internal edge of the second main wire and the internal edge of the first main wire may be equal to or greater than about 1 µm and equal to or less than about 500 µm in a second direction perpendicular to the first direction.

According to the embodiments, when the static electricity is generated into the display device, the defects are prevented from being generated to the display device.

DETAILED DESCRIPTION

Figure 1:
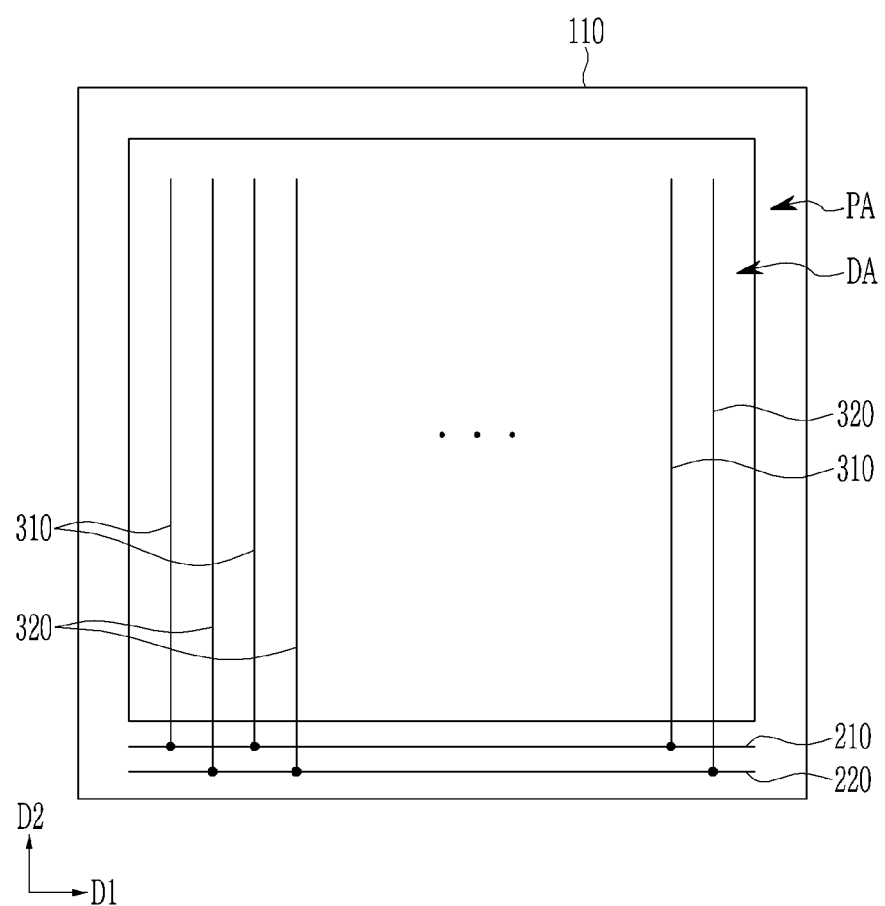
FIG. 1 shows a top plan view of a display device according to an embodiment.

The present invention will be described more fully hereinafter with reference to the accompanying drawings, in which embodiments of the invention are shown. As those skilled in the art would realize, the described embodiments may be modified in various different ways, all without departing from the spirit or scope of the present invention.

Parts that are irrelevant to the description will be omitted to clearly describe the present invention, and the same elements will be designated by the same reference numerals throughout the specification.

The size and thickness of each configuration shown in the drawings are arbitrarily shown for better understanding and ease of description, but the present invention is not limited thereto. The thickness of layers, films, panels, regions, etc. are exaggerated for clarity. The thicknesses of some layers and areas are exaggerated for convenience of explanation.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/ or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means positioned on or below the object portion, and does not necessarily mean positioned on the upper side of the object portion based on a gravitational direction.

Furthermore, relative terms, such as "on", "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements.

The exemplary terms "below" or "beneath" can, therefore, encompass both an orientation of above and below.

Unless explicitly described to the contrary, the word "comprise" and variations such as "comprises" or "comprising" will be understood to imply the inclusion of stated elements but not the exclusion of any other elements.

The phrase "in a plan view" means viewing an object portion from the top, and the phrase "in a cross-sectional view" means viewing a cross-section of which the object portion is vertically cut from the side.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

A display device according to an embodiment will now be described with reference to FIG. 1 to FIG. 6.

Figure 2:
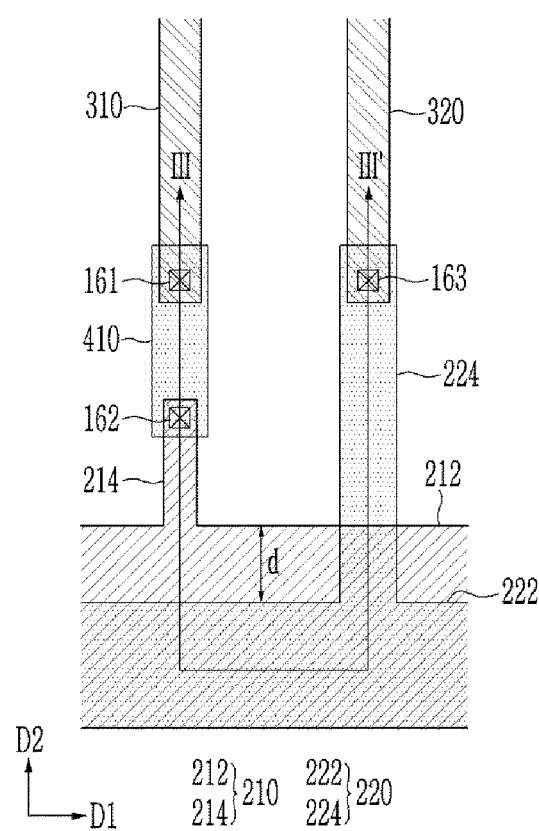
FIG. 2 shows a top plan view of a display device according to an embodiment.
Figure 3:
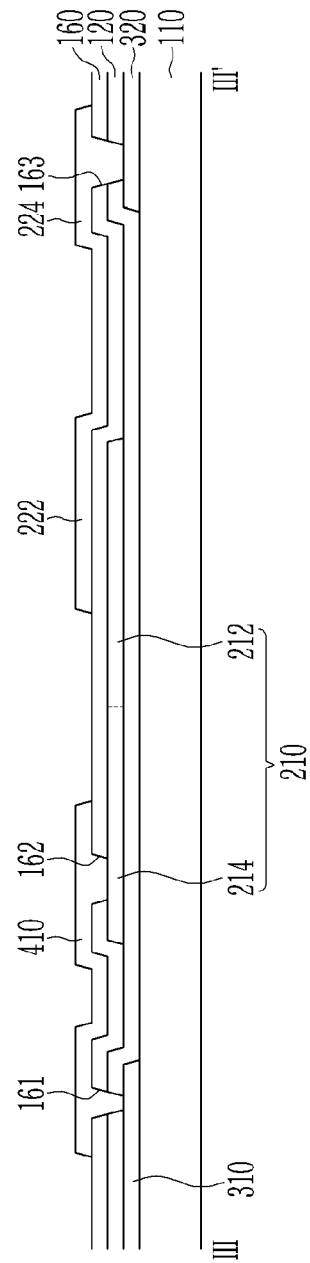
FIG. 3 shows a cross-sectional view of a display device according to an embodiment with respect to line III-III' of FIG. 2.
Figure 4:
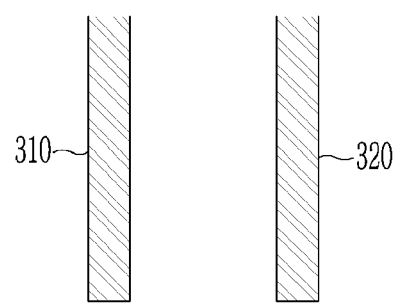
FIG. 4 to FIG. 6 sequentially show top plan views in order of manufacturing a display device according to an embodiment.
Figure 5:
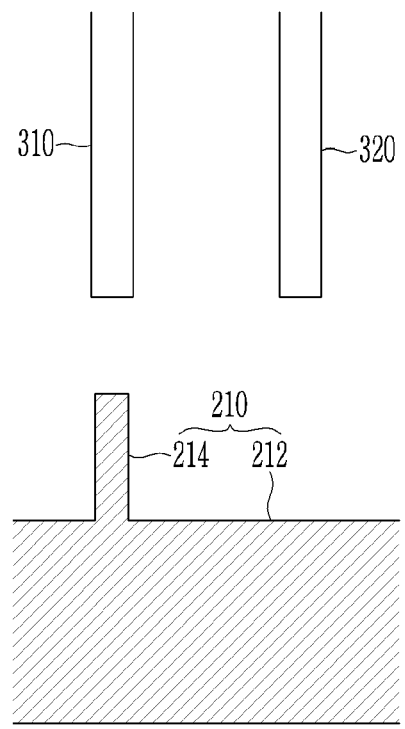
Figure 6:
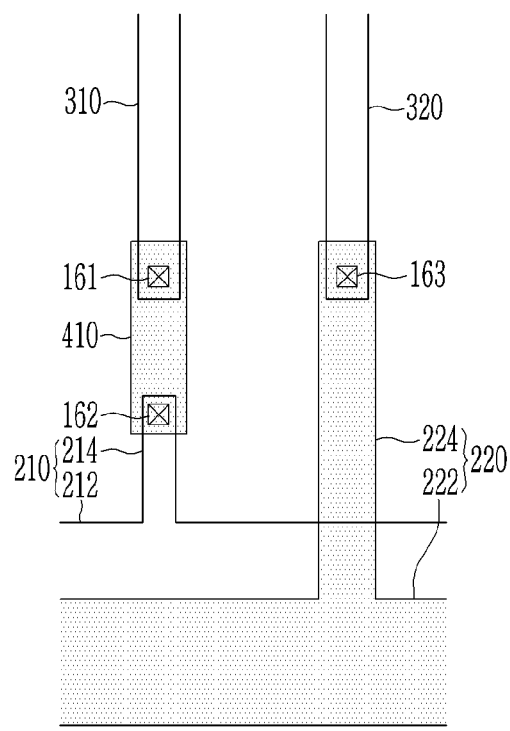

FIG. 1 shows a top plan view of a display device according to an embodiment, FIG. 2 shows a top plan view of a display device according to an embodiment, and FIG. 3 shows a cross-sectional view of a display device according to an embodiment with respect to line III-III' of FIG. 2. FIG. 4 to FIG. 6 sequentially show top plan views in order of manufacturing a display device according to an embodiment.

As shown in FIG. 1, the display device according to an embodiment includes a substrate 110.

The substrate 110 may include a display area DA and a peripheral area PA. The display area DA is a region in which pixels including light emitting diodes ("LED") and transistors are formed to display images, and the peripheral area PA is a region displaying no images. The peripheral area PA is positioned outside the display area DA, and it may surround the display area DA. The peripheral area PA is a region in which wires and pads for supplying driving signals to the pixels are disposed.

A plurality of pixels including transistors and light emitting diodes (LED) may be positioned in the display area DA. A plurality of pixels may be arranged in various forms, for example, in a matrix form.

A plurality of power wires and pad portions for transmitting driving signals such as voltages or signals to the pixels positioned in the display area DA may be positioned in the peripheral area PA. A plurality of power wires may include a first power supply line 210 and a second power supply line 220. The first power supply line 210 and the second power supply line 220 may extend as parallel lines. The first power supply line 210 and the second power supply line 220 may extend generally in a first direction D1. The first power supply line 210 and the second power supply line 220 may be disposed in the peripheral area PA. The first direction D1 may be referred as a row direction, may be parallel to an edge of the substrate 110, and may be parallel to a boundary between the display area DA and the peripheral area PA.

A driving voltage may be applied to the first power supply line 210. A common voltage may be applied to the second power supply line 220. That is, the first power supply line 210 may be a driving voltage supply wire, and the second power supply line 220 may be a common voltage supply wire. The invention is, however, not limited thereto, and the common voltage may be applied to the first power supply line 210, and the driving voltage may be applied to the second power supply line 220 in another embodiment. Further, other voltages may be applied to the first power supply line 210 and the second power supply line 220.

Although not shown, a flexible printed circuit board ("FPCB") may be attached to the peripheral area PA. The flexible printed circuit board (FPCB) may be electrically connected to the pad portion. The flexible printed circuit board (FPCB) may be electrically connected to the pad portion by an anisotropic conductive film ("ACF"). The flexible printed circuit board (FPCB) may include a driving integrated circuit ("IC"), and the driving signal output by the driving IC may be supplied to a power wire through a plurality of pads of the pad portion. That is, the driving voltage and the common voltage output by the driving IC may be supplied to the first power supply line 210 or the second power supply line 220 through the pad portion.

The display device according to an embodiment may further include a first power line 310 and a second power line 320. The first power line 310 and the second power line 320 may be positioned in the display area DA. The first power line 310 and the second power line 320 may extend as parallel lines. The first power line 310 and the second power line 320 may extend in a second direction D2 that is different from the first direction D1. The second direction D2 may be referred as a column direction crossing the first direction D1. The second direction D2 may perpendicularly traverse the first direction D1.

The first power line 310 may be connected to the first power supply line 210. Therefore, the first power line 310 may receive the driving voltage through the first power supply line 210. Further, the second power line 320 may be connected to the second power supply line 220. Therefore, the second power line 320 may receive the common voltage through the second power supply line 220. The first power line 310 and the second power line 320 may extend to the peripheral area PA. The first power line 310 may be connected to the first power supply line 210 in the peripheral area PA. Further, the second power line 320 may be connected to the second power supply line 220 in the peripheral area PA. The first power line 310 and the second power line 320 may be connected to the first power supply line 210 and the second power supply line 220, respectively, through a bridge wire, and in this instance, the bridge wire may extend to the display area DA. Depending on the cases, the first power line 310 and the second power line 320 may be positioned in the display area DA.

The display device according to an embodiment may include a plurality of first power lines 310 and a plurality of second power lines 320. In this instance, the first power supply line 210 may be connected to a plurality of first power lines 310, and the second power supply line 220 may be connected to a plurality of second power lines 320.

A first power supply line, a second power supply line, and a first power line and second power line of a display device according to an embodiment will now be described with reference to FIG. 2 to FIG. 6.

A first conductive layer including a first power line 310 and a second power line 320 may be positioned on the substrate 110. FIG. 4 shows the first conductive layer.

The substrate 110 may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, cellulose triacetate, and cellulose acetate propionate. The substrate 110 may be a rigid substrate or a flexible substrate that is bent, folded, or rolled. The substrate 110 may be a single layer or a multi-layer. The substrate 110 may be formed by alternately stacking at least one base layer with sequentially stacked polymer resins and at least one inorganic layer.

The first power line 310 and the second power line 320 may be positioned on the substrate 110, and may extend to be parallel to each other. FIG. 2 to FIG. 6 illustrate ends of the first power line 310 and the second power line 320. The first power line 310 and the second power line 320 may be positioned in the display area DA of the substrate 110, and may extend to the peripheral area PA. The first power line 310 and the second power line 320 may extend in a second direction D2 as its longitudinal direction. In this instance, the second direction D2 may be a column direction. The first power line 310 and the second power line 320 may be disposed to be spaced apart from each other by a predetermined interval in a plan view.

A second insulating layer 120 may be positioned on the first conductive layer including a first power line 310 and a second power line 320. A second conductive layer including a first power supply line 210 may be positioned on the second insulating layer 120. That is, a second insulating layer 120 may be positioned between the first conductive layer and the second conductive layer. FIG. 5 shows the first conductive layer and the second conductive layer.

The first power supply line 210 includes a first main wire 212 and a first sub-wire 214. The first main wire 212 and the first sub-wire 214 are positioned in the same layer, and are integrally formed (i.e., monolithic). The first main wire 212 may extend in the first direction D1 as its longitudinal direction. The first direction D1 may be a row direction. The first main wire 212 may extend in a direction that is different from the direction in which the first power line 310 extends. The first main wire 212 may extend in a direction traversing the first power line 310. The first sub-wire 214 is branched from the first main wire 212. The first sub-wire 214 protrudes toward the first power line 310 from the first main wire 212. That is, the first sub-wire 214 is diverged toward the display area DA from the first main wire 212. The first sub-wire 214 may be positioned to be near the end of the first power line 310. The first sub-wire 214 may extend in parallel with the first power line 310. That is, the first sub-wire 214 may extend in the second direction D2. The first sub-wire 214 and the first power line 310 may be positioned in the same virtual straight line extending in the second direction D2. The invention is, however, not limited thereto, and shapes of the first main wire 212 and the first sub-wire 214, and their position relationship with the first power line 310, may be modifiable in various ways.

A first insulating layer 160 may be positioned on the second conductive layer including a first power supply line 210. A third conductive layer including a second power supply line 220 may be positioned on the first insulating layer 160. That is, a first insulating layer 160 may be positioned between the second conductive layer and the third conductive layer. FIG. 6 illustrates the first conductive layer, the second conductive layer, and the third conductive layer.

The second power supply line 220 includes a second main wire 222 and a second sub-wire 224. The second main wire 222 and the second sub-wire 224 are positioned in the same layer, and are integrally formed (i.e., monolithic). The second main wire 222 may extend in the first direction D1 as its longitudinal direction. The first direction D1 may be a row direction. The second main wire 222 may extend in a direction that is different from the direction in which the second power line 320 extends. The second main wire 222 may extend in a direction traversing the second power line 320. The second sub-wire 224 is branched from the second main wire 222. The second sub-wire 224 protrudes toward the second power line 320 from the second main wire 222. That is, the second sub-wire 224 is diverged toward the display area DA from the second main wire 222. The second sub-wire 224 may be positioned to be near the end of the second power line 320. The second sub-wire 224 may extend in parallel with the second power line 320. That is, the second sub-wire 224 may extend in the second direction D2. The second sub-wire 224 and the second power line 320 may be positioned in the same virtual straight line extending in the second direction D2. The invention is, however, not limited thereto, and shapes of the second main wire 222 and the second sub-wire 224, and their position relationship with the second power line 320, may be modifiable in various ways.

The second main wire 222 may overlap part of the first main wire 212 in a plan view. The first main wire 212 may include an internal edge positioned near the first sub-wire 214 and facing the display area DA and an external edge opposite to the internal edge. The internal edge and the external edge of the first main wire 212 may extend in the first direction D1. The first sub-wire 214 protrudes from the internal edge of the first main wire 212. The second main wire 222 does not overlap the internal edge of the first main wire 212 in a plan view. The second main wire 222 may overlap the external edge of the first main wire 212 in the plan view. The second main wire 222 may include an internal edge positioned near the second sub-wire 224 and facing the display area DA and an external edge opposite to the internal edge. The internal edge and the external edge of the second main wire 222 may extend in the first direction D1. The second sub-wire 224 protruded from the internal edge of the second main wire 222. The internal edge of the second main wire 222 is separated from the internal edge of the first main wire 212, and the separation distance d between the internal edges of the first and second main wires 212 and 222 in the second direction D2 is equal to or greater than about 1 micrometers (μm), and may be equal to or less than about 500 μm. That is, a width of a region in which the first main wire 212 does not overlap the second main wire 222 may be equal to or greater than about 1 μm, and may be equal to or less than about 500 μm in the second direction D2.

Therefore, the display device according to an embodiment may have a configuration in which a portion of the first sub-wire 214 in which the first sub-wire 214 is diverged from the first main wire 212 and a peripheral region of the portion are not covered by the third conductive layer. Damage caused by static electricity may be generated to the peripheral region of the portion in which the first sub-wire 214 is diverged from the first main wire 212. For example, a portion of the first insulating layer 160 positioned on the peripheral region of the portion in which the first sub-wire 214 is diverged from the first main wire 212 may be damaged by the static electricity. In this instance, when a wire is positioned on the damaged first insulating layer 160, the corresponding wire and the first power supply line 210 may be short-circuited through the damaged first insulating layer 160. The display device according to an embodiment may prevent the generation of a short circuit by not disposing the third conductive layer on the portion in which the first sub-wire 214 is diverged from the first main wire 212. That is, the second main wire 222 is disposed not to overlap the internal edge of the first main wire 212 but to be spaced apart from the same with a predetermined interval in a plan view, thereby preventing generation of the short circuit.

It has been described that the second main wire 222 partly overlaps the first main wire 212 in a plan view, but the invention is not limited thereto. The second main wire 222 may not overlap the first main wire 212 in another embodiment. That is, the second main wire 222 may not overlap the internal edge and the external edge of the first main wire 212 in a plan view. In this instance, the second main wire 222 may be positioned to be spaced apart from the first main wire 212 in a plan view. That is, the second main wire 222 may not overlap the internal edge and the external edge of the first main wire 212, but may be positioned to be spaced apart from the external edge of the first main wire 212 with a predetermined interval in a plan view.

A width of the second main wire 222 in the second direction D2 is illustrated to be less than a width of the first main wire 212 in the second direction D2 in FIG. 2. However, the invention is not limited thereto. Further, the external edge of the second main wire 222 is illustrated to correspond to the external edge of the first main wire 212, but the invention is not limited thereto. The width of the first main wire 212 may be substantially the same as the width of the second main wire 222 in another embodiment. In this instance, the external edge of the first main wire 212 may be positioned to be nearer the display area DA than the external edge of the second main wire 222 such that the internal edge of the first main wire 212 does not overlap the second main wire 222 in a plan view. Further, the width of the first main wire 212 may be less than the width of the second main wire 222 in still another embodiment.

The second sub-wire 224 may at least partly overlap the second power line 320. A first insulating layer 160 may be positioned between the second sub-wire 224 and the second power line 320. An opening 163 may be defined in the first insulating layer 160. The second sub-wire 224 may be connected to the second power line 320 through the opening 163. The common voltage may be applied to the second power supply line 220, and the second power line 320 may receive the common voltage through the second power supply line 220.

The third conductive layer may further include a connection electrode 410. The connection electrode 410 may be positioned on the first insulating layer 160, and may overlap the first sub-wire 214 of the first power supply line 210 and the first power line 310 in a plan view. One end of the connection electrode 410 may overlap the first power line 310. The first insulating layer 160 may define an opening 161 therein, and the opening 161 may overlap the connection electrode 410 and the first power line 310 in a plan view. The opening 161 may also be positioned on the second insulating layer 120. The connection electrode 410 may be connected to the first power line 310 through the opening 161. Another end of the connection electrode 410 may overlap the first sub-wire 214. The first insulating layer 160 may define an opening 162 therein, and the opening 162 may overlap the connection electrode 410 and the first sub-wire 214 in a plan view. The connection electrode 410 may be connected to the first sub-wire 214 through the opening 162. Therefore, the first power supply line 210 may be connected to the first power line 310 by the connection electrode 410. The driving voltage may be applied to the first power supply line 210, and the first power line 310 may receive the driving voltage through the first power supply line 210.

At least one of a first conductive layer, a second conductive layer, and a third conductive layer may include at least one of metals including copper (Cu), aluminum (Al), magnesium (Mg), silver (Ag), gold (Au), platinum (Pt), palladium (Pd), nickel (Ni), neodymium (Nd), iridium (Ir), molybdenum (Mo), tungsten (W), titanium (Ti), chromium (Cr), and tantalum (Ta), or an alloy thereof. The first conductive layer, the second conductive layer, and the third conductive layer may be configured to be a single layer or a multilayer, respectively. For example, they may have a multilayered structure including a lower layer including titanium and an upper layer including copper.

The display device according to an embodiment may further include a semiconductor layer. Transistors configured with patterns positioned in a semiconductor layer, a first conductive layer, a second conductive layer, and a third conductive layer may be positioned in the display area DA of the display device according to an embodiment. The transistors may be positioned for respective pixels, and one pixel may include a plurality of transistors. Further, pixel electrodes connected to the transistors may further be disposed, and a light emitting diode (LED) may be configured on the pixel electrode by stacking the emission layer and the common electrode. Each pixel may be connected to the first power line 310 and the second power line 320 to receive the driving voltage and the common voltage.

In addition, an encapsulation layer including an inorganic insulating material and an organic insulating material may be positioned on the common electrode, and a filling layer including a filler may be positioned on the encapsulation layer. A cover layer including an insulating material, a color conversion layer, and a transmission layer may be positioned on the filling layer. The color conversion layer may be positioned on some pixels, and the transmission layer may be positioned on some other pixels. The color conversion layer may include semiconductor nanocrystal, and the semiconductor nanocrystal may include at least one of a phosphor for converting incident light into a color and a quantum dot material. The quantum dot may control the color of light emitted according to particle sizes, and the quantum dot may have various emitting colors such as blue, red, or green. The transmission layer may transmit the incident light, and may include a polymer material.

Figure 7:
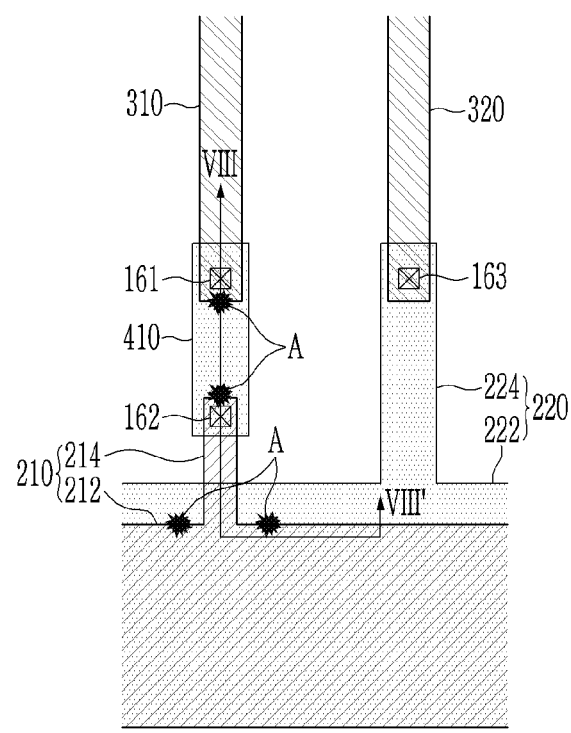
FIG. 7 shows a top plan view of a display device according to a reference example.
Figure 8:
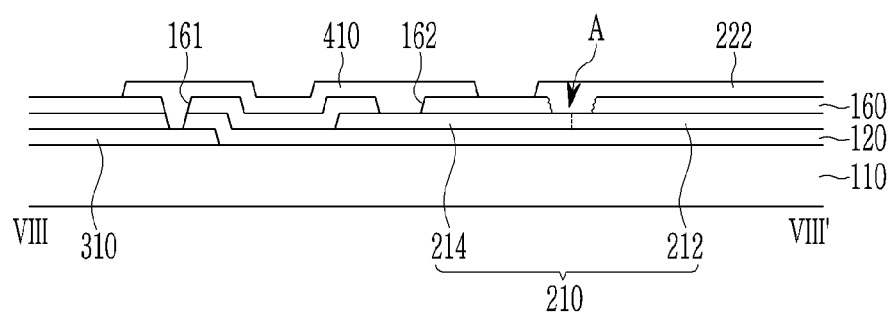
FIG. 8 shows a cross-sectional view of a display device with respect to line VIII-VIII' of FIG. 7 according to a reference example.

A display device according to a reference example and a display device according to an embodiment will now be compared to each other with reference to FIG. 7 and FIG. 8.

FIG. 7 shows a top plan view of a display device according to a reference example, and FIG. 8 shows a cross-sectional view of a display device with respect to line VIII-VIII' of FIG. 7 according to a reference example.

As shown in FIG. 7 and FIG. 8, the display device according to a reference example may include a substrate 110, a first power supply line 210, a second power supply line 220, a first power line 310, and a second power line 320 in a like manner of the display device according to an embodiment.

Regarding the display device according to a reference example, the second main wire 222 may overlap the first main wire 212, differing from the display device according to an embodiment. The second main wire 222 may overlap an internal edge of the first main wire 212. Therefore, a portion in which the first sub-wire 214 diverges from the first main wire 212 overlaps the second main wire 222 in a plan view. That is, the portion in which the first sub-wire 214 diverges from the first main wire 212 may have a configuration covered by the third conductive layer.

Static electricity may be generated in the process for manufacturing a display device, and the generated static electricity may be input to the first power line 310 and the first power supply line 210. In this instance, the input static electricity may be induced to a region at which the first sub-wire 214 branches from the first main wire 212, an end of the first sub-wire 214, and an end of the first power line 310, and the above-noted region A that is weak to static electricity may be damaged. For example, the first insulating layer 160 positioned on the first main wire 212 may be damaged in the region in which the first sub-wire 214 diverges from the first main wire 212. In this instance, the first main wire 212 positioned below the damaged first insulating layer 160 may be exposed. When a second main wire 222 is formed on the first insulating layer 160 in a subsequent process, the second main wire 222 and the first main wire 212 may be short-circuited. As the first main wire 212 to which the driving voltage is applied and the second main wire 222 to which the common voltage is applied are short-circuited, an electrical defect is generated, and the display device may not be normally driven. The damage of the first insulating layer 160 near the end of the first sub-wire 214 and the end of the first power line 310 from among the regions (A) that are weak to static electricity does not make such problem above since the corresponding regions (i.e., the first sub-wire 214 and the end of the first power line 310) are already connected to the connection electrode 410 (i.e., already electrically connected).

In the display device according to an embodiment, the portion in which the first sub-wire 214 extends from the first main wire 212 does not overlap the second main wire 222 in a plan view. That is, the display device according to an embodiment may prevent generation of a short circuit by not disposing the third conductive layer to the portion in which the first sub-wire 214 diverges from the first main wire 212.

A display device according to another embodiment will now be described with reference to FIG. 9.

The display device according to an embodiment shown in FIG. 9 mostly corresponds to the display device according to an embodiment described with reference to FIG. 1 to FIG. 6, so no same portions will be described, repeatedly. The present embodiment is different from the previous embodiment in that the first power supply line is positioned on the first conductive layer.

Figure 9:
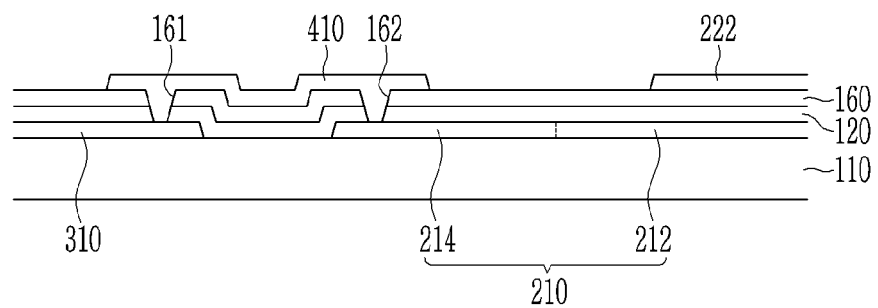
FIG. 9 shows a cross-sectional view of a display device according to another embodiment.

FIG. 9 shows a cross-sectional view of a display device according to another embodiment.

As shown in FIG. 9, the display device according to this embodiment may include a substrate 110, a first power supply line 210, a second power supply line 220, a first power line 310, and a second power line 320.

The first power supply line 210 may be positioned in the second conductive layer in the previous embodiment, and the first power supply line 210_1 may be positioned in the first conductive layer in the present embodiment.

The first power supply line 210 may be positioned in the same layer as the first power line 310. A second insulating layer 120 and a first insulating layer 160 may be positioned on the first power supply line 210 in this embodiment. The second insulating layer 120 and the first insulating layer 160 may be positioned between the first sub-wire 214 of the first power supply line 210 and the connection electrode 410. The first insulating layer 160 may define an opening 162 therein, and the opening 162 may overlap the connection electrode 410 and the first sub-wire 214 in a plan view. The opening 162 may be positioned in the second insulating layer 120. The connection electrode 410 may be connected to the first sub-wire 214 through the opening 162.

The display device according to this embodiment may, in a like manner of the previous embodiment, have a configuration in which a peripheral portion of the portion in which the first sub-wire 214 diverges from the first main wire 212 is not covered by the third conductive layer. The display device according to this embodiment may prevent the generation of a short circuit by not disposing the second main wire 222 on the portion in which the first sub-wire 214 branches from the first main wire 212 in a plan view. That is, the second main wire 222 is disposed not to overlap the internal edge of the first main wire 212 but to be spaced apart from the same with a predetermined interval in a plan view, thereby preventing generation of the short circuit.

A display device according to still another embodiment will now be described with reference to FIG. 10.

The display device according to an embodiment shown in FIG. 10 mostly corresponds to the display device according to an embodiment described with reference to FIG. 1 to FIG. 6, so no same portions will be described repeatedly. The present embodiment is different from the previous embodiment in that the first power line is positioned in the second conductive layer.

Figure 10:
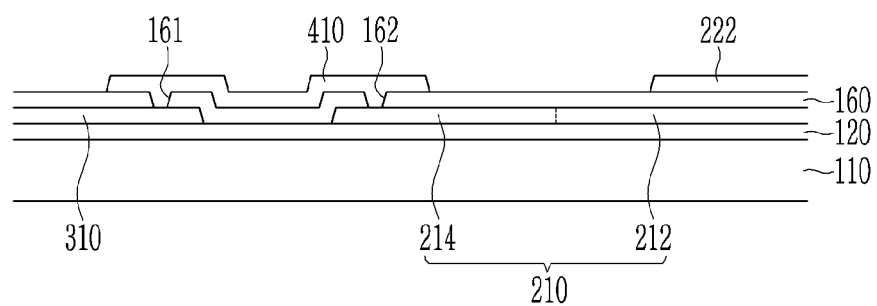
FIG. 10 shows a cross-sectional view of a display device according to still another embodiment.

FIG. 10 shows a cross-sectional view of a display device according to the still another embodiment.

As shown in FIG. 10, the display device according to an embodiment may include a substrate 110, a first power supply line 210, a second power supply line 220, a first power line 310, and a second power line 320.

The first power line 310 may be positioned in the first conductive layer in the previous embodiment, and the first power line 310 may be positioned in the second conductive layer in the present embodiment.

The first power line 310 may be positioned in the same layer as the first power supply line 210. A first insulating layer 160 may be positioned on the first power line 310. The first insulating layer 160 may define an opening 161 therein, and the opening 161 may overlap the connection electrode 410 and the first power line 310 in a plan view. The connection electrode 410 may be connected to the first power line 310 through the opening 161.

The display device according to the present embodiment may, in a like manner of the previous embodiment, have a configuration in which a peripheral portion of the portion at which the first sub-wire 214 extends from the first main wire 212 is not covered by the third conductive layer. The display device according to this embodiment may prevent the generation of a short circuit by not disposing the second main wire 222 on the portion in which the first sub-wire 214 diverges from the first main wire 212. That is, the second main wire 222 is disposed not to overlap the internal edge of the first main wire 212 but to be spaced apart from the same with a predetermined interval in a plan view, thereby preventing generation of the short circuit.

A display device according to an embodiment will now be described with reference to FIG. 11 to FIG. 15.

The display device according to an embodiment shown in FIG. 11 to FIG. 15 mostly corresponds to the display device according to an embodiment described with reference to FIG. 1 to FIG. 6, so no same portions will be described repeatedly. The present embodiment is different from the previous embodiment in that the first power line includes a first portion and a second portion positioned in different layers, and a plurality of openings are defined in connectors of the respective wires, which will now be described.

Figure 11:
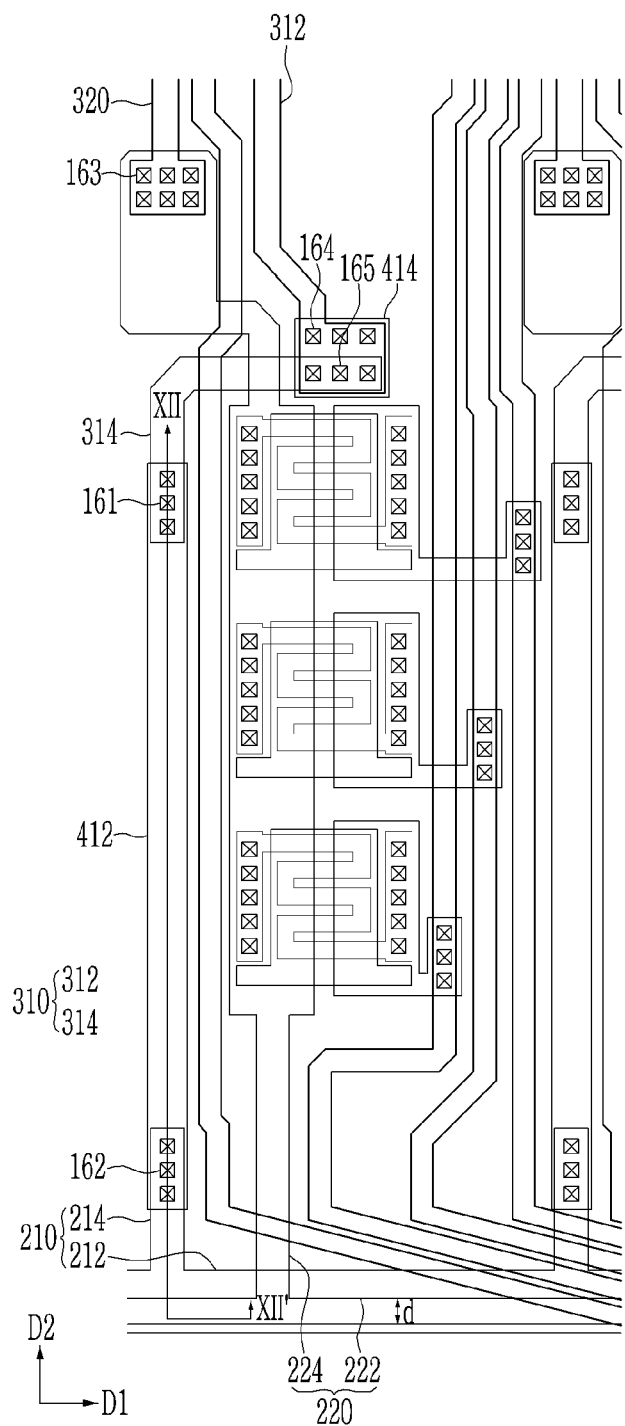
FIG. 11 shows a top plan view of a display device according to an embodiment.
Figure 12:
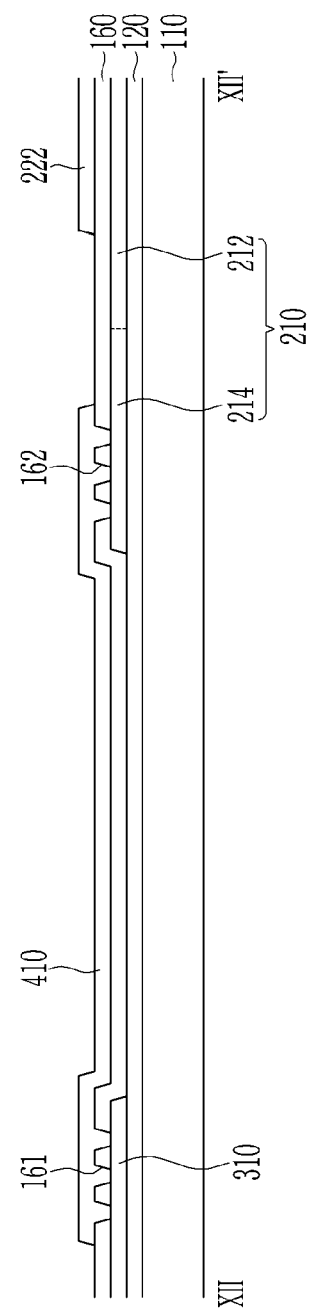
FIG. 12 shows a cross-sectional view of a display device with respect to line XII-XII' of FIG. 11 according to an embodiment.
Figure 13:
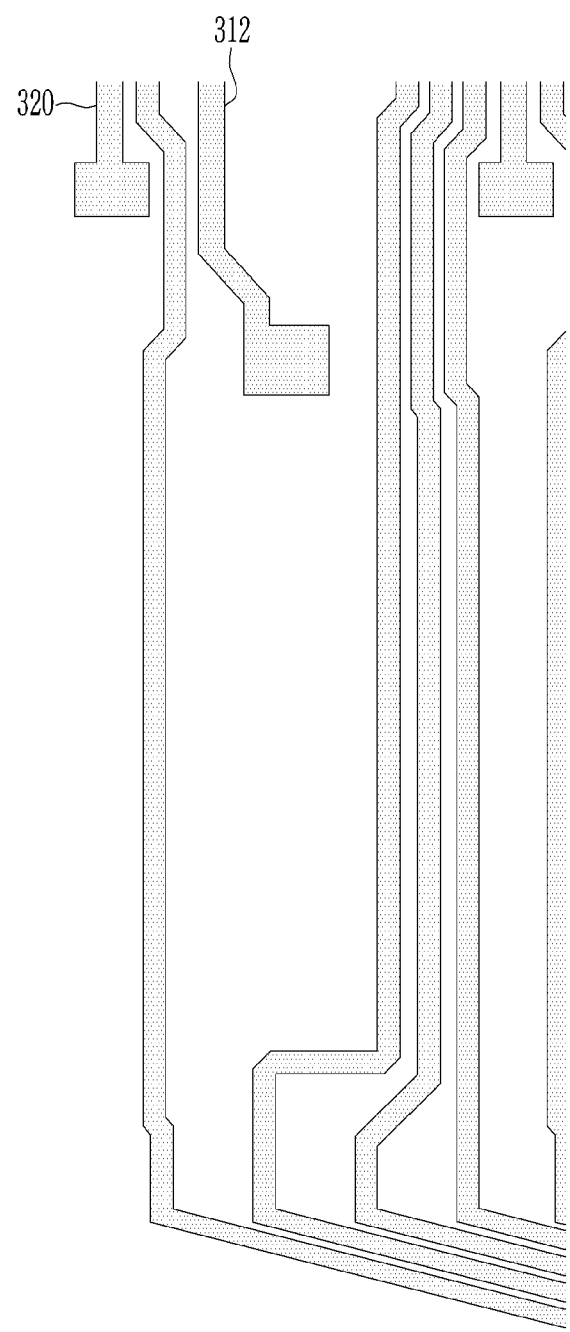
FIG. 13 to FIG. 15 sequentially show top plan views in order of manufacturing a display device according to an embodiment.
Figure 14:
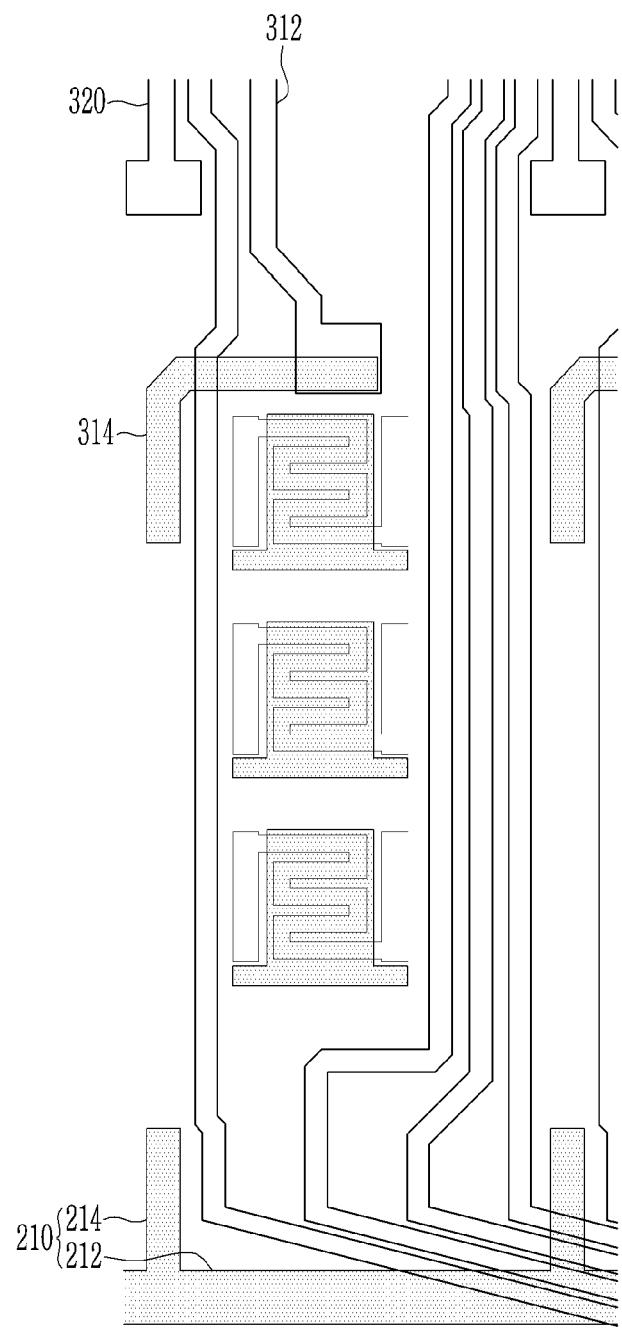
Figure 15:
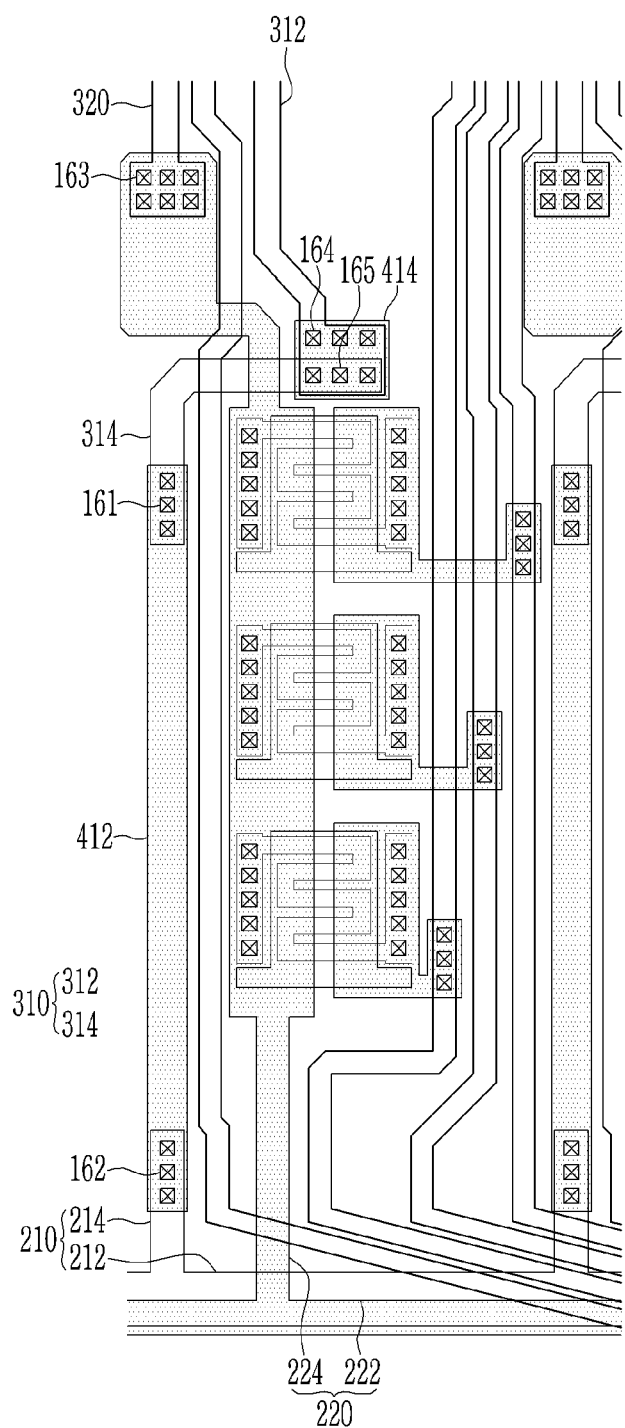

FIG. 11 shows a top plan view of a display device according to an embodiment, and FIG. 12 shows a cross-sectional view of a display device with respect to line XII-XII' of FIG. 11 according to an embodiment. FIG. 13 to FIG. 15 sequentially show top plan views in order of manufacturing a display device according to an embodiment.

As shown in FIG. 11 to FIG. 15, the display device according to an embodiment may include a substrate 110, a first power supply line 210, a second power supply line 220, a first power line 310, and a second power line 320.

First, a first conductive layer including part of the first power line 310, and the second power line 320 may be positioned on the substrate 110. FIG. 13 illustrates the first conductive layer.

The first power line 310 may include a first portion 312 and a second portion 314. The first portion 312 of the first power line 310 may be positioned in the first conductive layer. The first portion 312 of the first power line 310 extends generally in a second direction D2. The first portion 312 of the first power line 310 may have a shape that is bent in a predetermined region, and may extend obliquely with respect to the second direction D2. An end of the first power line 310 may have a wider width than the other portion. An end of the second power line 320 may have a wider width than the other portion.

A second insulating layer 120 may be positioned on the first conductive layer including a first portion 312 of the first power line 310 and the second power line 320. A second conductive layer including a second portion 314 of the first power line 310 and the first power supply line 210 may be positioned on the second insulating layer 120. That is, the second insulating layer 120 may be positioned between the first conductive layer and the second conductive layer. FIG. 14 illustrates a first conductive layer and a second conductive layer.

The second portion 314 of the first power line 310 may have a shape that is bent in a predetermined region. An end of the second portion 314 of the first power line 310 may overlap the end of the first portion 312 in a plan view. The invention is, however, not limited thereto, and the end of the second portion 314 of the first power line 310 may not overlap the end of the first portion 312 in another embodiment.

The first power supply line 210 includes a first main wire 212 and a first sub-wire 214. The first main wire 212 may extend in the first direction D1 as its longitudinal direction. The first sub-wire 214 may protrude toward the first power line 310 from the first main wire 212. That is, the first sub-wire 214 diverges toward the display area DA from the first main wire 212. The first sub-wire 214 may be positioned in a virtual straight line extending to the second portion 314 of the first power line 310 in the second direction D2. The invention is, however, not limited thereto, and shapes of the first main wire 212 and the first sub-wire 214, and a position relationship with the first power line 310, are modifiable in many ways.

A first insulating layer 160 may be positioned on the second conductive layer including the second portion 314 of the first power line 310 and the first power supply line 210. A third conductive layer including a second power supply line 220 may be positioned on the first insulating layer 160. That is, a first insulating layer 160 may be positioned between the second conductive layer and the third conductive layer. FIG. 15 illustrates a first conductive layer, a second conductive layer, and a third conductive layer.

The second power supply line 220 includes a second main wire 222 and a second sub-wire 224. The second main wire 222 may extend in the first direction D1 as its longitudinal direction. The second sub-wire 224 protrudes toward the second power line 320 from the second main wire 222. That is, the second sub-wire 224 diverges in the display area DA from the second main wire 222. The second sub-wire 224 may have a shape that is bent in a predetermined region. The second sub-wire 224 may extend generally in the second direction D2 as its longitudinal direction.

The second main wire 222 may overlap part of the first main wire 212. The second main wire 222 does not overlap the internal edge of the first main wire 212. The second main wire 222 may overlap the external edge of the first main wire 212. The internal edge of the second main wire 222 is spaced apart from the internal edge of the first main wire 212 in a plan view, and a space distance d between the internal edge of the second main wire 222 and the internal edge of the first main wire 212 in the second direction D2 may be equal to or greater than about 1 µm, and equal to or less than about 500 µm. That is, the width of the region in which the first main wire 212 does not overlap the second main wire 222 may be equal to or greater than about 1 µm and equal to or less than about 500 µm.

Therefore, the display device according to an embodiment may have a configuration in which a peripheral region of the portion in which the first sub-wire 214 diverges from the first main wire 212 is not covered by the third conductive layer. The display device according to an embodiment may prevent the generation of a short circuit by not disposing the second main wire 222 on the portion in which the first sub-wire 214 diverges from the first main wire 212. That is, the second main wire 222 does not overlap the internal edge of the first main wire 212, but is spaced therefrom with a predetermined interval, thereby preventing the short-circuit defect.

The second main wire 222 has been described to partly overlap the first main wire 212, but the invention is not limited thereto. The second main wire 222 may not overlap the first main wire 212 in another embodiment. Further, the width of the second main wire 222 is illustrated to be less than the width of the first main wire 212 in FIG. 11, but the invention is not limited thereto. The width of the first main wire 212 may be substantially the same as the width of the second main wire 222 or may be equal to or less than the width of the second main wire 222 in another embodiment. Further, the external edge of the second main wire 222 is illustrated to be positioned outside the external edge of the first main wire 212, but the invention is not limited thereto. The external edge of the second main wire 222 may correspond to the external edge of the first main wire 212 in another embodiment.

The second sub-wire 224 may at least partly overlap the second power line 320. A first insulating layer 160 may be positioned between the second sub-wire 224 and the second power line 320. A plurality of openings 163 may be positioned in the first insulating layer 160. The second sub-wire 224 may be connected to the second power line 320 through a plurality of openings 163. The common voltage may be applied to the second power supply line 220, and the second power line 320 may receive the common voltage through the second power supply line 220.

The third conductive layer may further include a first connection electrode 412 and a second connection electrode 414.

The first connection electrode 412 may be positioned on the first insulating layer 160, and may overlap the first sub-wire 214 of the first power supply line 210 and the second portion 314 of the first power line 310. One end of the first connection electrode 412 may overlap the second portion 314 of the first power line 310. The first insulating layer 160 may include a plurality of openings 161, and the openings 161 may overlap the first connection electrode 412 and the second portion 314 of the first power line 310. The first connection electrode 412 may be connected to the first power line 310 through a plurality of openings 161. Another end of the first connection electrode 412 may overlap the first sub-wire 214. The first insulating layer 160 may include a plurality of openings 162, and the openings 162 may overlap the first connection electrode 412 and the first sub-wire 214. The first connection electrode 412 may be connected to the first sub-wire 214 through a plurality of openings 162. Therefore, the first sub-wire 214 of the first power supply line 210 may be connected to the second portion 314 of the first power line 310 by the first connection electrode 412. The driving voltage may be applied to the first power supply line 210, and the first power line 310 may receive the driving voltage through the first power supply line 210.

The second connection electrode 414 may be positioned on the first insulating layer 160, the first power line 310, the first portion 312, and the second portion 314. Part of the second connection electrode 414 may overlap the first portion 312 of the first power line 310. A second insulating layer 120 and a first insulating layer 160 may be positioned between the second connection electrode 414 and the first portion 312 of the first power line 310. A plurality of openings 164 overlapping the second connection electrode 414 and the first portion 312 of the first power line 310 may be provided in the second insulating layer 120 and the first insulating layer 160. The second connection electrode 414 may be connected to the first portion 312 of the first power line 310 through a plurality of openings 164. Another part of the second connection electrode 414 may overlap the second portion 314 of the first power line 310. A first insulating layer 160 may be positioned between the second connection electrode 414 and the second portion 314 of the first power line 310. A plurality of openings 165 overlapping the second connection electrode 414 and the second portion 314 of the first power line 310 may be provided in the first insulating layer 160. The second connection electrode 414 may be connected to the second portion 314 of the first power line 310 through a plurality of openings 165. Therefore, the first portion 312 and the second portion 314 of the first power line 310 may be connected to each other by the second connection electrode 414.

A display device according to an embodiment will now be described with reference to FIG. 16 to FIG. 20.

The display device according to an embodiment described with reference to FIG. 16 to FIG. 20 mostly corresponds to the display device according to an embodiment described with reference to FIG. 1 to FIG. 6, so no same portions will be described repeatedly. The present embodiment is different from the previous embodiment in that a plurality of openings are defined in connections of the respective wires, and the external edge of the first main wire does not correspond to the external edge of the second main wire.

Figure 16:
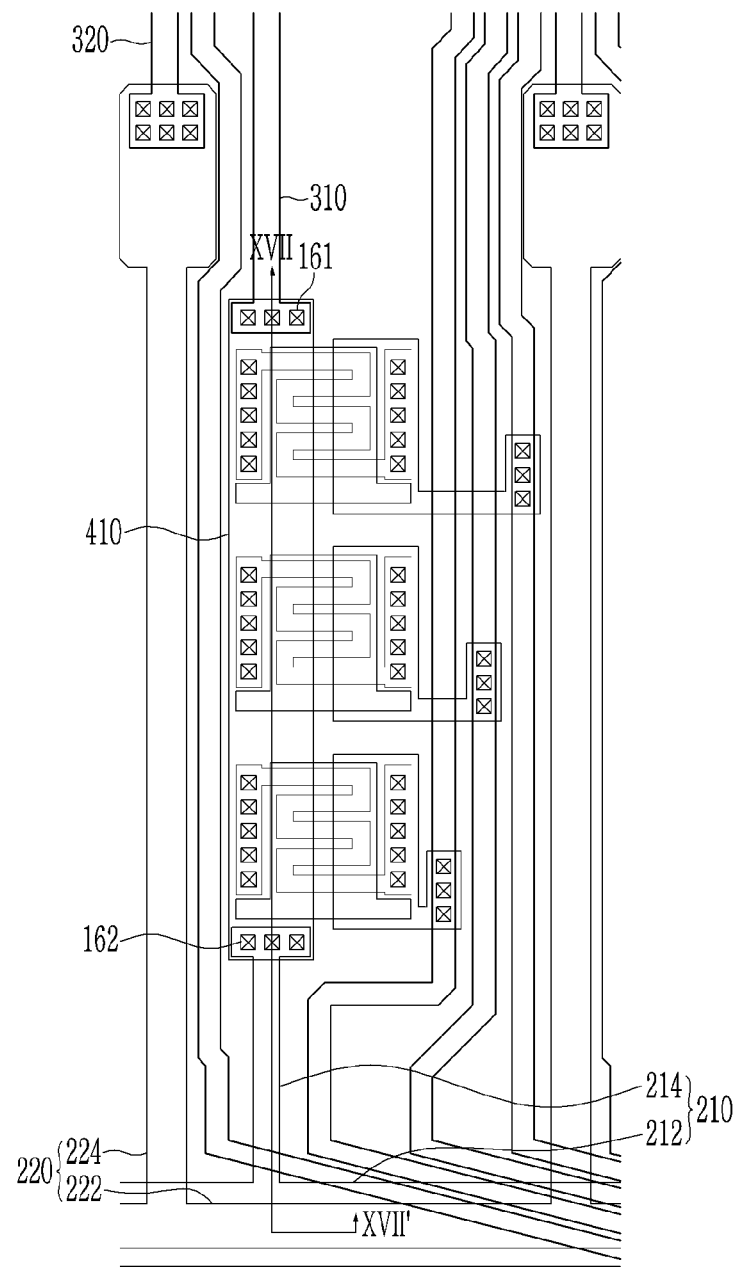
FIG. 16 shows a top plan view of a display device according to an embodiment.
Figure 17:
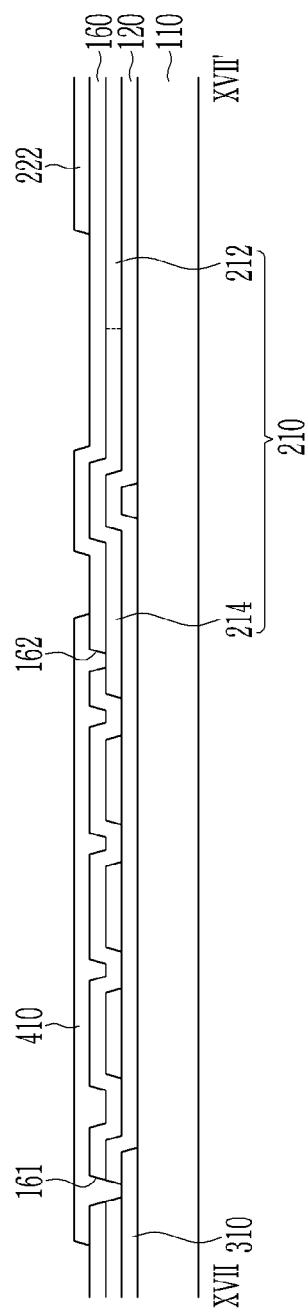
FIG. 17 shows a cross-sectional view of a display device with respect to line XVII-XVII' of FIG. 16 according to an embodiment.
Figure 18:
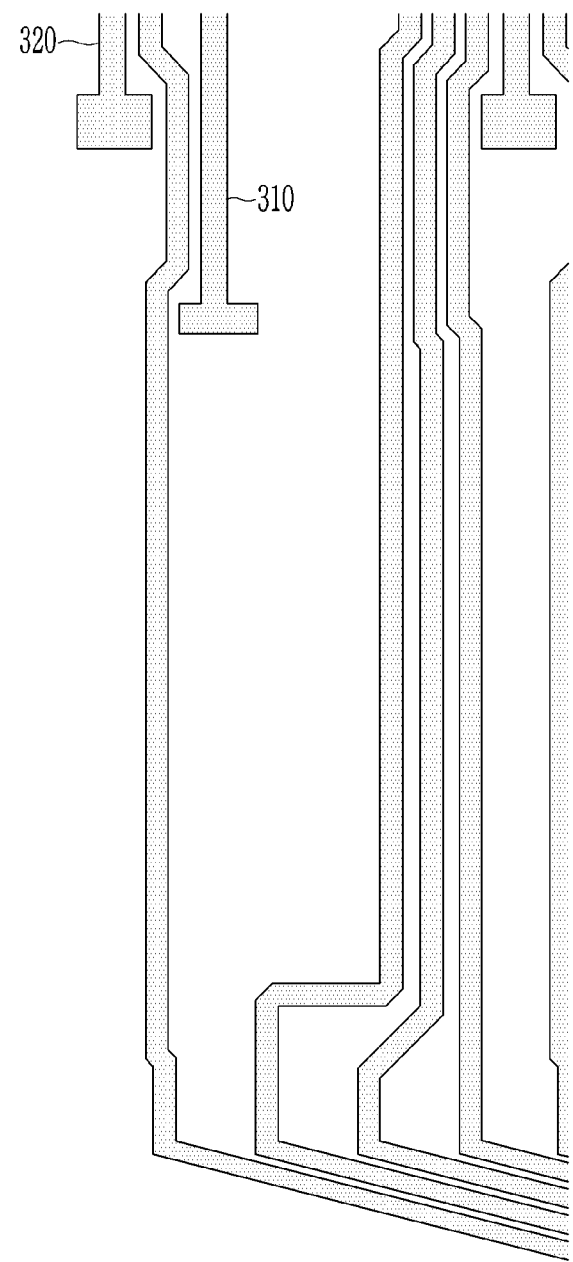
FIG. 18 to FIG. 20 sequentially show top plan views in order of manufacturing a display device according to an embodiment.
Figure 19:
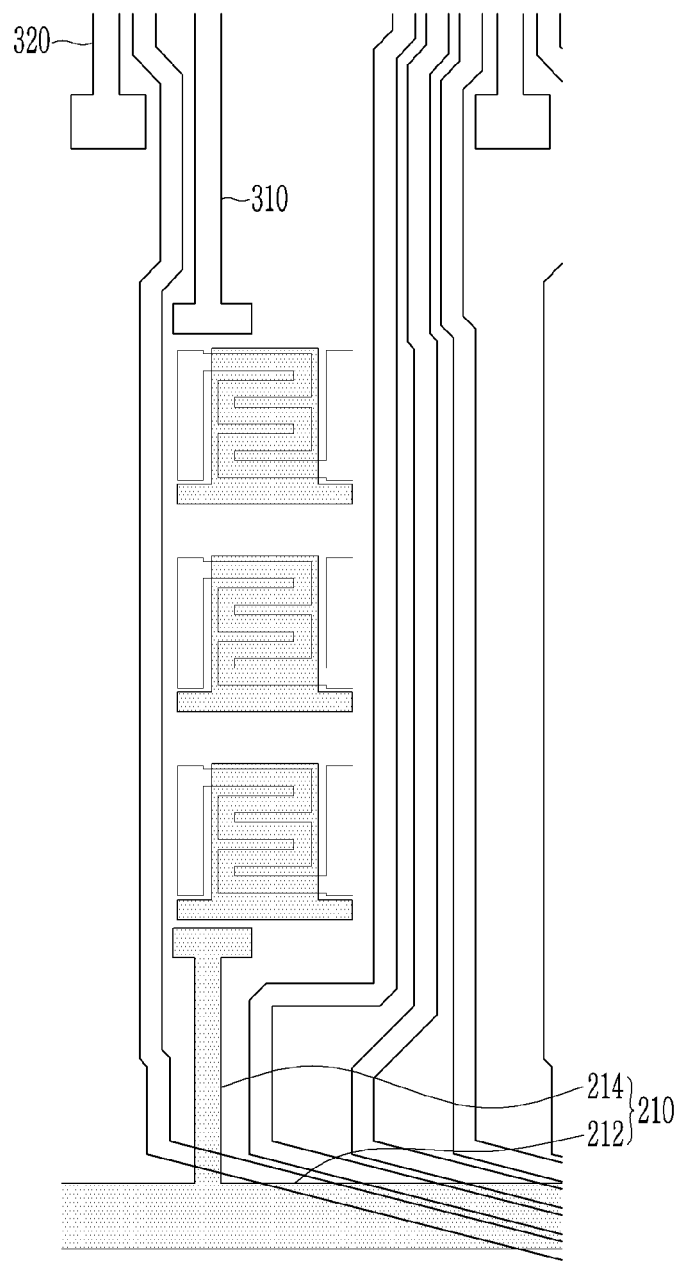
Figure 20:
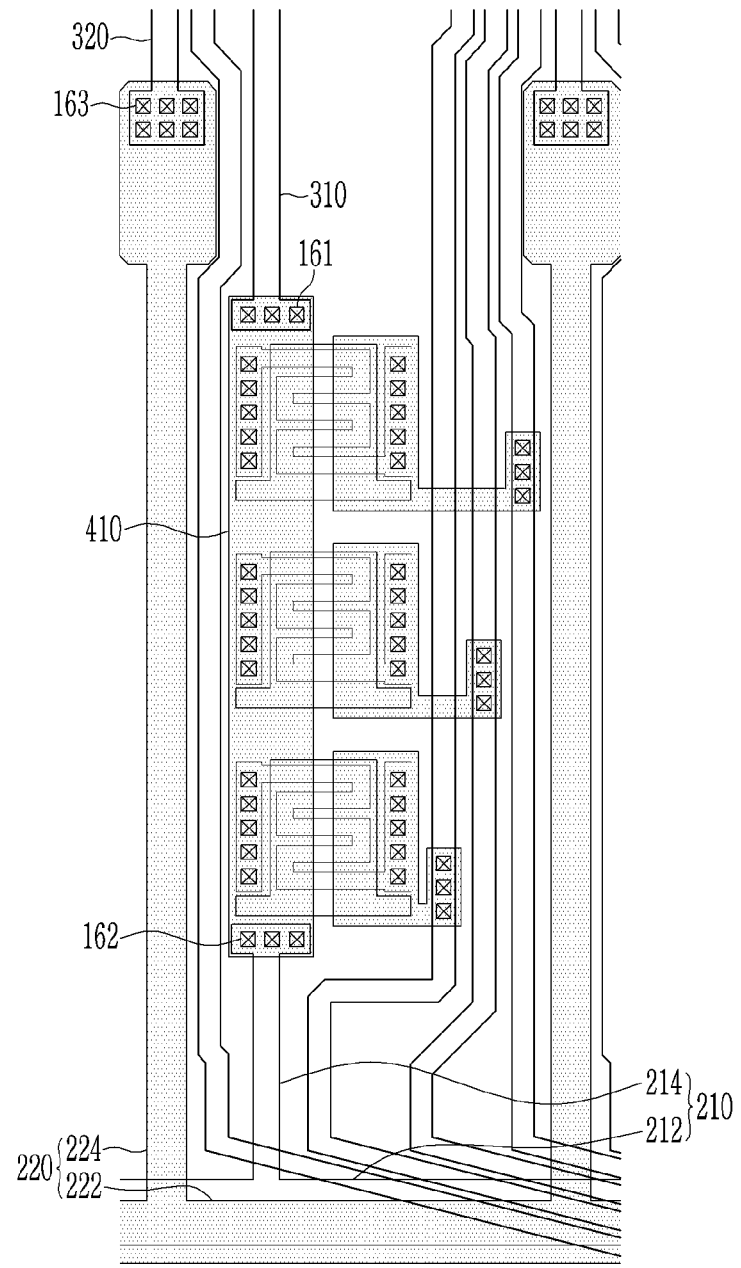

FIG. 16 shows a top plan view of a display device according to an embodiment, and FIG. 17 shows a cross-sectional view of a display device with respect to line XVII-XVII' of FIG. 16 according to an embodiment. FIG. 18 to FIG. 20 sequentially show top plan views in order of manufacturing a display device according to an embodiment.

As shown in FIG. 16 to FIG. 20, the display device according to an embodiment may include a substrate 110, a first power supply line 210, a second power supply line 220, a first power line 310, and a second power line 320.

A first conductive layer including a first power line 310 and a second power line 320 may be positioned on the substrate 110. FIG. 18 illustrates a first conductive layer.

The first power line 310 and the second power line 320 may be positioned on the substrate 110, and may extend in parallel with each other. An end of the first power line 310 may have a greater width than other portions. An end of the second power line 320 may have a greater width than other portions.

A second insulating layer 120 may be positioned on the first conductive layer including a first power line 310 and a second power line 320. A second conductive layer including a first power supply line 210 may be positioned on the second insulating layer 120. That is, the second insulating layer 120 may be positioned between the first conductive layer and the second conductive layer. FIG. 19 illustrates a first conductive layer and a second conductive layer.

The first power supply line 210 includes a first main wire 212 and a first sub-wire 214. The first main wire 212 may extend in the first direction D1 as its longitudinal direction. The first sub-wire 214 protrudes toward the first power line 310 from the first main wire 212. That is, the first sub-wire 214 diverges toward the display area DA from the first main wire 212. The first sub-wire 214 and the first power line 310 may be positioned in a virtual straight line extending in the second direction D2. The invention is, however, not limited thereto, and shapes of the first main wire 212 and the first sub-wire 214, and their position relationship with the first power line 310, are variable in many ways.

A first insulating layer 160 may be positioned on the second conductive layer including a first power supply line 210. A third conductive layer including a second power supply line 220 may be positioned on the first insulating layer 160. That is, the first insulating layer 160 may be positioned between the second conductive layer and the third conductive layer. FIG. 20 shows a first conductive layer, a second conductive layer, and a third conductive layer.

The second power supply line 220 includes a second main wire 222 and a second sub-wire 224. The second main wire 222 may extend in the first direction D1 as its longitudinal direction. The second sub-wire 224 protrudes toward the second power line 320 from the second main wire 222. That is, the second sub-wire 224 diverges toward the display area DA from the second main wire 222. The second sub-wire 224 may extends in the second direction D2 as its longitudinal direction.

The second main wire 222 may overlap part of the first main wire 212. The second main wire 222 does not overlap the internal edge of the first main wire 212. The second main wire 222 may overlap the external edge of the first main wire 212. The internal edge of the second main wire 222 is spaced apart from the internal edge of the first main wire 212 in a plan view, and the spaced distance d between the internal edge of the second main wire 222 and the internal edge of the first main wire 212 in the second direction D2 may be equal to or greater than about 1 μm and equal to or less than about 500 μm. That is, the width of the region in which the first main wire 212 does not overlap the second main wire 222 in the second direction D2 may be equal to or greater than about 1 μm and equal to or less than about 500 μm.

Therefore, the display device according to an embodiment may have a configuration in which a peripheral region of the portion in which the first sub-wire 214 diverges from the first main wire 212 is not covered by the third conductive layer. The display device according to an embodiment may prevent generation of a short circuit by not disposing the second main wire 222 on the portion in which the first sub-wire 214 diverges from the first main wire 212. That is, the second main wire 222 does not overlap the internal edge of the first main wire 212, but is disposed to be spaced therefrom with a predetermined interval, thereby preventing the short-circuit defect.

The second main wire 222 has been described to partly overlap the first main wire 212, but the invention is not limited thereto. The second main wire 222 may not overlap the first main wire 212. Further, the width of the second main wire 222 has been shown to be less than the width of the first main wire 212 in FIG. 16, but the invention is not limited thereto. The width of the first main wire 212 may be substantially the same as or may be less than the width of the second main wire 222 in another embodiment. Further, the external edge of the second main wire 222 is illustrated to be positioned outside the external edge of the first main wire 212, but the invention is not limited thereto. The external edge of the second main wire 222 may correspond to the external edge of the first main wire 212 in another embodiment.

The second sub-wire 224 may at least partly overlap the second power line 320. A first insulating layer 160 may be positioned between the second sub-wire 224 and the second power line 320. A plurality of openings 163 may be positioned in the first insulating layer 160. The second sub-wire 224 may be connected to the second power line 320 through a plurality of openings 163. The common voltage may be applied to the second power supply line 220, and the second power line 320 may receive the common voltage through the second power supply line 220.

The third conductive layer may further include a connection electrode 410. The connection electrode 410 may be positioned on the first insulating layer 160, and may overlap the first sub-wire 214 of the first power supply line 210 and the first power line 310. One end of the connection electrode 410 may overlap the first power line 310. The first insulating layer 160 may include a plurality of openings 161, and the openings 161 may overlap the connection electrode 410 and the first power line 310. A plurality of openings 161 may be defined in the second insulating layer 120. The connection electrode 410 may be connected to the first power line 310 through a plurality of openings 161. Another end of the connection electrode 410 may overlap the first sub-wire 214. The first insulating layer 160 may include a plurality of openings 162, and the openings 162 may overlap the connection electrode 410 and the first sub-wire 214. The connection electrode 410 may be connected to the first sub-wire 214 through a plurality of openings 162. Therefore, the first power supply line 210 may be connected to the first power line 310 by the connection electrode 410.

While this disclosure has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS

110: substrate
120: second insulating layer
160: first insulating layer
210: first power supply line
212: first main wire
214: first sub-wire
220: second power supply line
222: second main wire
224: second sub-wire
310: first power line
320: second power line

What is claimed is:

1. A display device comprising:
a substrate including a display area and a peripheral area positioned outside the display area;
a first power supply line positioned in the peripheral area of the substrate;
a first insulating layer positioned on the first power supply line; and
a second power supply line positioned on the first insulating layer and positioned in the peripheral area of the substrate,
wherein the first power supply line includes a first main wire extending in a first direction and a first sub-wire diverging toward the display area from the first main wire,
the second power supply line includes a second main wire extending in the first direction and a second sub-wire diverging toward the display area from the second main wire,
the first main wire includes an internal edge positioned near the first sub-wire and facing the display area and an external edge opposite to the internal edge, and
the second main wire does not overlap the internal edge of the first main wire in a plan view.

2. The display device of claim 1, wherein
the second main wire includes an internal edge positioned near the second sub-wire and facing the display area and an external edge opposite to the internal edge of the second main wire, and
the internal edge of the second main wire is spaced apart from the internal edge of the first main wire in the plan view.

3. The display device of claim 2, wherein
a spaced distance between the internal edge of the second main wire and the internal edge of the first main wire is equal to or greater than about 1 micrometers (μm) and equal to or less than about 500 μm in a second direction perpendicular to the first direction.

4. The display device of claim 1, wherein
the second main wire overlaps part of the first main wire in the plan view, and
a width of a portion in which the first main wire does not overlap the second main wire is equal to or greater than 1 μm and equal to or less than 500 μm in a second direction perpendicular to the first direction.

5. The display device of claim 1, further comprising:
a first power line electrically connected to the first power supply line and positioned in the display area of the substrate; and
a second power line electrically connected to the second power supply line and positioned in the display area of the substrate.

6. The display device of claim 5, wherein
the first power line and the second power line extend to the peripheral area of the substrate.

7. The display device of claim 5, further comprising
a second insulating layer positioned on the first power line and the second power line,
wherein the first power supply line is positioned on the second insulating layer.

8. The display device of claim 7, further comprising
a connection electrode positioned on the first insulating layer and connected to the first power line and the first power supply line.

9. The display device of claim 8, wherein
the first insulating layer and the second insulating layer define a first opening overlapping the first power line in the plan view,
the connection electrode is connected to the first power line through the first opening,
the first insulating layer defines a second opening overlapping the first sub-wire in the plan view, and
the connection electrode is connected to the first sub-wire through the second opening.

10. The display device of claim 5, wherein
the first power line and the second power line are positioned in a same layer as the first power supply line.

11. The display device of claim 10, further comprising
a connection electrode positioned on the first insulating layer and connected to the first power line and the first power supply line.

12. The display device of claim 5, wherein
the first insulating layer defines a third opening overlapping the second power line and the second sub-wire in the plan view, and
the second sub-wire is connected to the second power line through the third opening.

13. The display device of claim 5, further comprising
the first power line including a first portion and a second portion positioned in different layers from each other,
a second insulating layer positioned between the first portion and the second portion, and
a connection electrode which connects the first portion and the second portion.

14. The display device of claim 13, wherein
the first insulating layer and the second insulating layer define a fourth opening overlapping the first portion of the first power line in the plan view,
the connection electrode is connected to the first portion of the first power line through the fourth opening,
the first insulating layer defines a fifth opening overlapping the second portion of the first power line in the plan view, and
the connection electrode is connected to the second portion of the first power line through the fifth opening.

15. The display device of claim 1, wherein
a driving voltage is applied to the first power supply line, and
a common voltage is applied to the second power supply line.

16. A display device comprising:
a substrate including a display area and a peripheral area positioned outside the display area;
a first power supply line positioned in the peripheral area of the substrate;
an insulating layer positioned on the first power supply line;
a second power supply line positioned on the insulating layer and positioned in the peripheral area of the substrate;
a first power line electrically connected to the first power supply line and positioned in the display area of the substrate; and
a second power line electrically connected to the second power supply line and positioned in the display area of the substrate,
wherein the first power supply line includes a first main wire extending in a first direction and a first sub-wire diverging toward the first power line from the first main wire,
the second power supply line includes a second main wire extending in the first direction and a second sub-wire diverging toward the second power line from the second main wire, and
the second main wire does not overlap a portion in which the first sub-wire diverges from the first main wire in a plan view.

17. The display device of claim 16, wherein
the first main wire includes an internal edge positioned near the first sub-wire and in parallel with the first direction and an external edge opposite to the internal edge, and
the second main wire does not overlap the internal edge of the first main wire.

18. The display device of claim 17, wherein
the external edge of the first main wire is parallel to the first direction, and
the second main wire overlaps the external edge of the first main wire in the plan view.

19. The display device of claim 17, wherein
the second main wire includes an internal edge positioned near the second sub-wire and an external edge opposite to the internal edge of the second main wire, and
the external edge of the second main wire corresponds to the external edge of the first main wire.

20. The display device of claim 17, wherein
the second main wire includes an internal edge positioned near the second sub-wire and an external edge opposite to the internal edge of the second main wire, and
a spaced distance between the internal edge of the second main wire and the internal edge of the first main wire is equal to or greater than about 1 μm and equal to or less than about 500 μm in a second direction perpendicular to the first direction.

* * * * *